(12) United States Patent
Namai et al.

(10) Patent No.: US 8,703,395 B2
(45) Date of Patent: Apr. 22, 2014

(54) PATTERN-FORMING METHOD

(75) Inventors: Hayato Namai, Tokyo (JP); Hiroki Nakagawa, Tokyo (JP); Kentaro Harada, Tokyo (JP); Takehiko Naruoka, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/283,582

(22) Filed: Oct. 28, 2011

(65) Prior Publication Data

US 2013/0107235 A1 May 2, 2013

(51) Int. Cl.
  *G03F 7/26* (2006.01)
(52) U.S. Cl.
  USPC .......................... 430/315; 430/330; 430/314
(58) Field of Classification Search
  USPC .................................. 430/322, 315, 314, 330
  See application file for complete search history.

(56) References Cited

U.S. PATENT DOCUMENTS

| | | | |
|---|---|---|---|
| 3,395,117 A * | 7/1968 | Burzynski et al. ............... | 528/12 |
| 2002/0165319 A1 * | 11/2002 | Knasiak et al. ................ | 525/100 |
| 2008/0187860 A1 * | 8/2008 | Tsubaki et al. ............ | 430/270.1 |
| 2008/0193658 A1 * | 8/2008 | Millward ...................... | 427/401 |
| 2009/0212016 A1 | 8/2009 | Cheng et al. | |
| 2009/0214823 A1 | 8/2009 | Cheng et al. | |
| 2011/0147984 A1 * | 6/2011 | Cheng et al. .................. | 264/220 |

FOREIGN PATENT DOCUMENTS

| | | |
|---|---|---|
| EP | 0159428 | 10/1985 |
| JP | 59-93448 | 5/1984 |
| JP | 6-12452 | 1/1994 |
| JP | 2008-310314 | 12/2008 |
| WO | WO 2012/169620 | 12/2012 |

OTHER PUBLICATIONS

Daniel P. Sanders et al., "Integration of Directed Self-Assembly with 193 nm Lithography", Journal of Photopolymer Science and Technology, Jul. 16, 2010, vol. 23, No. 1, pp. 11-18.
Joy Y. Cheng et al., "Simple and Versatile Method to Integrate Directed Self-Assembly with Optical Lithography Using a Polarity-Switched Photoresist", ACS NANO, Jul. 15, 2010, vol. 4, No. 8, pp. 4815-4823.
International Search Report for corresponding International Application No. PCT/JP2012/006869, Dec. 25, 2012.
International Written Opinion for corresponding International Application No. PCT/JP2012/006869, Dec. 25, 2012.

* cited by examiner

*Primary Examiner* — Cynthia Kelly
*Assistant Examiner* — Caleen Sullivan
(74) *Attorney, Agent, or Firm* — Ditthavong Mori & Steiner, P.C.

(57) ABSTRACT

A pattern-forming method includes applying a photoresist composition to a substrate to form a resist film. The photoresist composition includes an acid generator and a first polymer that includes an acid-dissociable group. The resist film is exposed. The resist film is developed using a developer having an organic solvent content of 80 mass % or more to form a prepattern of the resist film. A polymer film having a phase separation structure in a space defined by the prepattern is formed using a composition that includes a plurality of second polymers. A part of the phase separation structure of the polymer film is removed.

14 Claims, No Drawings

PATTERN-FORMING METHOD

BACKGROUND OF THE INVENTION

1. Field of the Invention

The present invention relates to a pattern-forming method.

2. Discussion of the Background

A reduction in line width of a resist pattern used for lithography has been desired along with miniaturization of the structure of electronic devices (e.g., semiconductor devices and liquid crystal devices). It has been studied to form a fine resist pattern having a line width of about 90 nm using ArF excimer laser light (short-wavelength radiation). Various photoresist compositions adapted to such short-wavelength radiation have been studied. For example, a photoresist composition that generates an acid in an exposed area upon exposure to electromagnetic waves or charged particle rays is known. A difference in solubility rate in a developer occurs between the exposed area and the unexposed area due to chemical reactions catalyzed by the acid so that a resist pattern is formed on a substrate.

In recent years, a method that can form a pattern that is finer than the resist pattern obtained by the above method and exhibits excellent lithographic performance has been desired.

SUMMARY OF THE INVENTION

According to one aspect of the present invention, a pattern-forming method includes applying a photoresist composition to a substrate to form a resist film. The photoresist composition includes an acid generator and a first polymer that includes an acid-dissociable group. The resist film is exposed. The resist film is developed using a developer having an organic solvent content of 80 mass % or more to form a prepattern of the resist film. A polymer film having a phase separation structure in a space defined by the prepattern is formed using a composition that includes a plurality of second polymers. A part of the phase separation structure of the polymer film is removed.

DESCRIPTION OF THE EMBODIMENTS

Embodiments of the invention provide the following pattern-forming methods.

[1] A pattern-forming method including (1) applying a photoresist composition to a substrate to form a resist film, exposing the resist film, and developing the exposed resist film using a developer having an organic solvent content of 80 mass % or more to form a prepattern, the photoresist composition including (A) a polymer that includes an acid-dissociable group, and (B) an acid generator (hereinafter may be referred to as "step (1)"), (2) forming a polymer film having a phase separation structure in a space defined by the prepattern using a composition that includes two or more polymers (hereinafter may be referred to as "step (2)"), and (3) removing part of the phase separation structure of the polymer film (hereinafter may be referred to as "step (3)").

[2] The pattern-forming method according to [1], wherein the step (3) removes a phase that is not adjacent to the prepattern.

[3] The pattern-forming method according to [1], wherein the part of the phase separation structure is removed by wet development.

[4] The pattern-forming method according to [1], wherein an underlayer film is formed on the substrate in advance.

[5] The pattern-forming method according to [4], wherein the underlayer film includes a spin-on carbon (SOC) film.

[6] The pattern-forming method according to [1], wherein at least one of the two or more polymers is a polysiloxane.

[7] The pattern-forming method according to [6], wherein the polysiloxane includes a structure obtained by hydrolysis and condensation of at least one hydrolyzable silane compound selected from (a1) a hydrolyzable silane compound shown by the following general formula (1) and (a2) a hydrolyzable silane compound shown by the following general formula (2), and has a polystyrene-reduced weight average molecular weight determined by gel permeation chromatography of 1000 to 200,000,

$$R^1_a SiX^1_{4-a} \quad (1)$$

wherein $R^1$ individually represents a fluorine atom, an alkylcarbonyloxy group, or a linear or branched alkyl group having 1 to 20 carbon atoms, $X^1$ individually represents a chlorine atom, a bromine atom, or $OR^a$ (wherein $R^a$ represents a monovalent organic group), and a is an integer from 1 to 3,

$$SiX^2_4 \quad (2)$$

wherein $X^2$ individually represents a chlorine atom, a bromine atom, or $OR^b$ (wherein $R^b$ represents a monovalent organic group).

[8] The pattern-forming method according to [7], wherein the polysiloxane further includes a structure obtained by hydrolysis and condensation of a hydrolyzable silane compound shown by the following general formula (3),

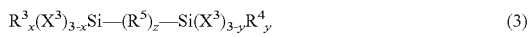

$$R^3_x(X^3)_{3-x}Si-(R^5)_z-Si(X^3)_{3-y}R^4_y \quad (3)$$

wherein $R^3$ individually represents a monovalent organic group, $R^4$ individually represents a monovalent organic group, $R^5$ individually represents an oxygen atom, a phenylene group, or a group shown by $-(CH_2)_n-$ (wherein n is an integer from 1 to 6), $X^3$ individually represents a halogen atom or $OR^c$ (wherein $R^c$ represents a monovalent organic group), x is an integer from 0 to 2, y is an integer from 0 to 2, and z is 0 or 1.

[9] The pattern-forming method according to [1], wherein at least one of the two or more polymers is an aromatic vinyl polymer.

[10] The pattern-forming method according to [1], wherein the acid-dissociable group included in the polymer (A) includes an alicyclic hydrocarbon group.

[11] The pattern-forming method according to [1], wherein the polymer (A) includes a structural unit shown by the following formula (4),

(4)

wherein R represents a hydrogen atom, a fluorine atom, a methyl group, or a trifluoromethyl group, and $R^p$ represents an acid-dissociable group shown by the following formula (i),

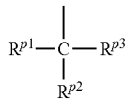

(i)

wherein $R^{p1}$ represents an alkyl group having 1 to 4 carbon atoms or a monovalent alicyclic hydrocarbon group having 4 to 12 carbon atoms, and $R^{p2}$ and $R^{p3}$ individually represent an alkyl group having 1 to 4 carbon atoms or a monovalent alicyclic hydrocarbon group having 4 to 12 carbon atoms, provided that $R^{p2}$ and $R^{p3}$ may bond to each other to form a divalent alicyclic hydrocarbon group having 4 to 12 carbon atoms together with the carbon atom bonded thereto.

[12] The pattern-forming method according to [1], wherein the organic solvent (B) is at least one solvent selected from the group consisting of ether solvents, ketone solvents, and ester solvents.

The above pattern-forming method can form a finer pattern that exhibits excellent lithographic performance.

Step (1)

A pattern-forming method according to one embodiment of the invention includes a step (1) that includes applying a photoresist composition to a substrate to form a resist film, exposing the resist film, and developing the exposed resist film using a developer having an organic solvent content of 80 mass % or more to form a prepattern, the photoresist composition including (A) a polymer that includes an acid-dissociable group, and (B) an acid generator.

Photoresist Composition

The photoresist composition used for the pattern-forming method according to one embodiment of the invention includes the polymer (A), the acid generator (B), and (C) a compound. Note that the photoresist composition may also include an optional component as long as the effects of the invention are not impaired. Each component is described in detail below.

Polymer (A)

The polymer (A) includes an acid-dissociable group. The term "acid-dissociable group" used herein refers to a group that substitutes the hydrogen atom of a carboxyl group, a hydroxyl group, or the like, and dissociates due to an acid generated by the acid generator (B) upon exposure. The polymer (A) that includes the acid-dissociable group becomes scarcely soluble in the organic solvent due to an increase in polarity when the acid-dissociable group dissociates in the exposed area. Therefore, a negative-tone resist pattern is obtained by the above pattern-forming method. The polymer (A) is not particularly limited as long as the polymer (A) includes the acid-dissociable group. The acid-dissociable group may be bonded to the main chain or the end (terminal) of the polymer (A). It is preferable that the polymer (A) include a structural unit (I) that includes the acid-dissociable group.

The structural unit (I) includes the acid-dissociable group. When the polymer (A) includes the structural unit (I), the acid-dissociable group can be effectively incorporated in the polymer (A), so that an excellent pattern can be formed.

The structural unit (I) is not particularly limited as long as the structural unit (I) includes the acid-dissociable group. The structural unit (I) may include one or more acid-dissociable groups. The acid-dissociable group may be bonded to an arbitrary position of the structural unit (I) as long as the acid-dissociable group substitutes the hydrogen atom of a polar functional group. The acid-dissociable group is not particularly limited as long as the acid-dissociable group dissociates due to an acid.

The acid-dissociable group preferably includes an alicyclic hydrocarbon group. When the acid-dissociable group includes an alicyclic hydrocarbon group, the dispersibility of the compound (C) that includes an alicyclic structure (described later) in the resist film is further improved. This makes it possible to improve the lithographic performance (e.g., suppression of roughness in the resist surface layer and circularity).

Specific examples of a preferable structural unit (I) include a structural unit shown by the formula (4) (hereinafter may be referred to as "structural unit (I-1)").

The structural unit (I-1) is a structural unit shown by the formula (4).

R in the formula (4) represents a hydrogen atom, a fluorine atom, a methyl group, or a trifluoromethyl group. $R^p$ represents an acid-dissociable group shown by the formula (i).

In the formula (i), $R^{p1}$ represents an alkyl group having 1 to 4 carbon atoms or a monovalent alicyclic hydrocarbon group having 4 to 12 carbon atoms, and $R^{p2}$ and $R^{p3}$ individually represent an alkyl group having 1 to 4 carbon atoms or a monovalent alicyclic hydrocarbon group having 4 to 12 carbon atoms, provided that $R^{p2}$ and $R^{p3}$ may bond to each other to form a divalent alicyclic hydrocarbon group having 4 to 12 carbon atoms together with the carbon atom bonded thereto.

Since the acid-dissociable group included in the structural unit (I-1) easily dissociates due to an acid, the contrast between the exposed area and the unexposed area increases, and the dissolution resistance of the resist film in the developer is improved. This makes it possible to adjust the basic performance (e.g., sensitivity and resolution) of the resist. Since a monomer that produces the structural unit (I-1) exhibits excellent copolymerizability, the acid-dissociable group content in the polymer (A) can be easily set to the desired value. Moreover, since a monomer that produces the structural unit (I-1) can be easily synthesized, an acid-dissociable group having the desired structure can be easily incorporated in the polymer (A).

Examples of the alkyl group having 1 to 4 carbon atoms represented by $R^{p1}$ to $R^{p3}$ in the formula (i) include a methyl group, an ethyl group, an n-propyl group, an i-propyl group, an n-butyl group, a 2-methylpropyl group, a 1-methylpropyl group, a t-butyl group, and the like.

Examples of the monovalent alicyclic hydrocarbon group having 4 to 12 carbon atoms represented by $R^{p1}$ to $R^{p3}$ in the formula (i) include polyalicyclic groups including a bridged skeleton (e.g., norbornane skeleton or adamantane skeleton), monoalicyclic groups including a cycloalkane skeleton (e.g., cyclopentane or cyclohexane), and hydrocarbon groups including such a monoalicyclic group or polyalicyclic group. These groups may be substituted with at least one linear, branched, or cyclic alkyl group having 1 to 10 carbon atoms, or the like.

Examples of the divalent alicyclic hydrocarbon group having 4 to 12 carbon atoms formed by $R^{p2}$ and $R^{p3}$ in the formula (i) include groups obtained by elimination of two hydrogen atoms bonded to a single carbon atom from polyalicyclic groups including a bridged skeleton (e.g., norbornane skeleton or adamantane skeleton), or monoalicyclic groups including a cycloalkane skeleton (e.g., cyclopentane or cyclohexane).

It is preferable that $R^{p1}$ represent an alkyl group having 1 to 4 carbon atoms, and $R^{p2}$ and $R^{p3}$ bond to each other to form a divalent alicyclic hydrocarbon group having 4 to 12 carbon atoms together with the carbon atom bonded thereto. When the acid-dissociable group including $R^{p1}$ to $R^{p3}$ has the above structure, the acid-dissociable group more easily dissociates due to an acid, so that roughness of the resist surface layer can be advantageously suppressed.

Examples of a preferable structural unit (I-1) include structural units shown by the following formulas (4-1) to (4-4).

(4-1)

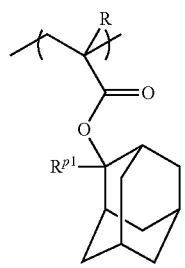

(4-2)

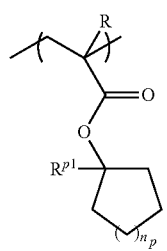

(4-3)

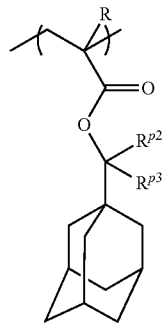

(4-4)

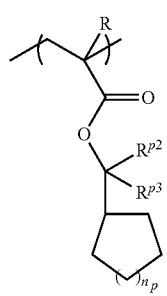

wherein R is the same as defined for the formula (4), $R^{p1}$ to $R^{p3}$ are the same as defined for the formula (i), and $n_p$ is an integer from 1 to 4.

Specific examples of the structural units shown by the formulas (4) and (4-1) to (4-4) include structural units shown by the following formulas.

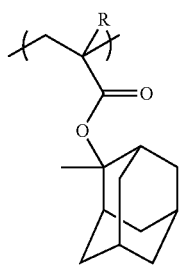

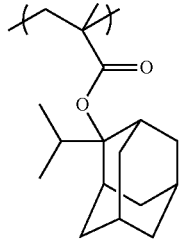

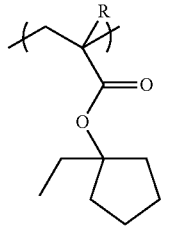

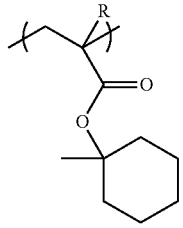

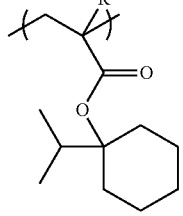

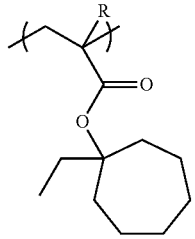

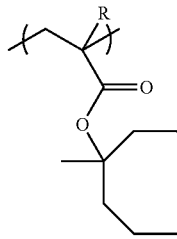

-continued

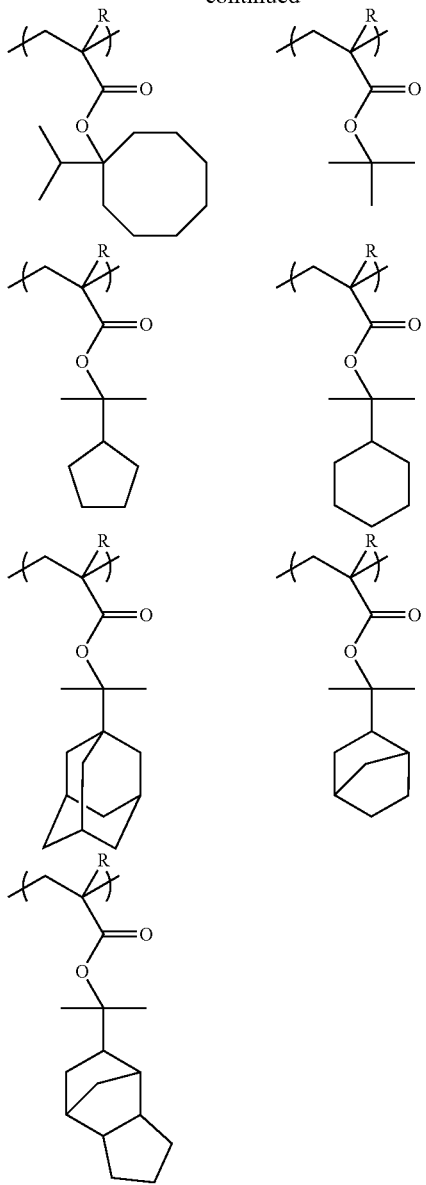

wherein R is the same as defined for the formula (4).

The content of the structural unit (I) in the polymer (A) is preferably 5 mol % or more, more preferably 10 mol % or more, still more preferably 20 mol % or more, particularly preferably 30 mol % or more, and most preferably 40 mol % or more, based on the total structural units included in the polymer (A). The content of the structural unit (I) in the polymer (A) is preferably 90 mol % or less, more preferably 80 mol % or less, still more preferably 70 mol % or less, and particularly preferably 60 mol % or less. If the content of the structural unit (I) is less than 5 mol %, the solubility of the exposed area in the developer may decrease, so that the resolution may decrease, or it may be difficult to form a pattern. If the content of the structural unit (I) exceeds 90 mol %, the pattern-formability may decrease. The polymer (A) may include only one type of structural unit (I), or may include two or more types of structural unit (I).

It is preferable that the polymer (A) further include a structural unit that includes at least one group selected from the group consisting of a lactone group and a cyclic carbonate group (hereinafter may be referred to as "structural unit (II)"). When the polymer (A) further includes a structural unit that includes a lactone group and/or a cyclic carbonate group, the basic performance (e.g., adhesion between the resist film and the substrate) of the resist can be further improved. Moreover, the solubility of the resist film in the developer can be improved. The term "lactone group" used herein refers to a cyclic group including one ring (lactone ring) that includes a bond shown by —O—C(O)—. The term "cyclic carbonate group" used herein refers to a cyclic group including one ring (cyclic carbonate ring) that includes a bond shown by —O—C(O)—O—. A group that includes only one lactone ring or cyclic carbonate ring is referred to as a monocyclic group, and a group that further includes another cyclic structure is referred to as a polycyclic group.

Examples of the structural unit that includes a lactone group include structural units shown by the following formulas.

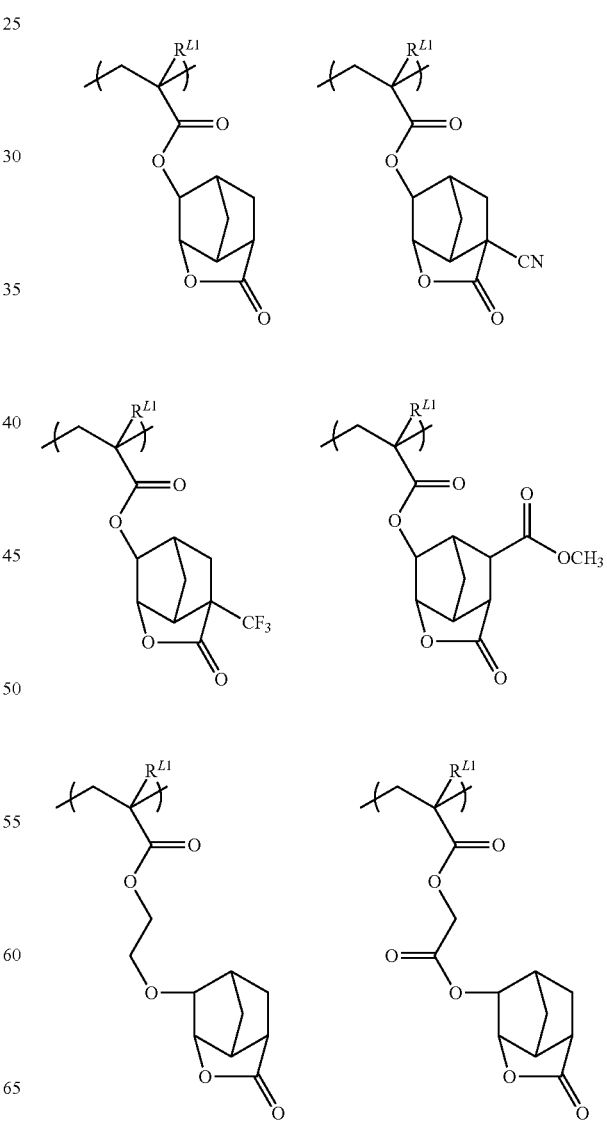

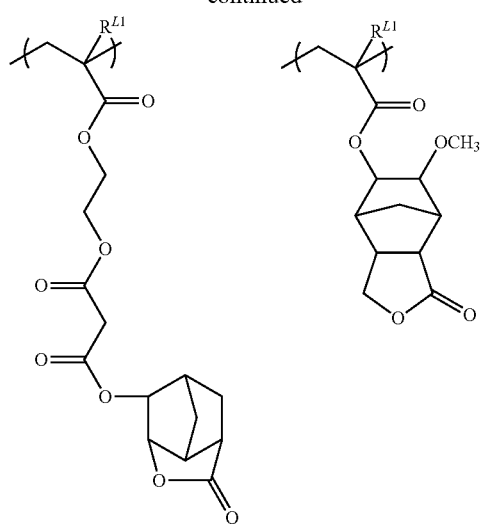
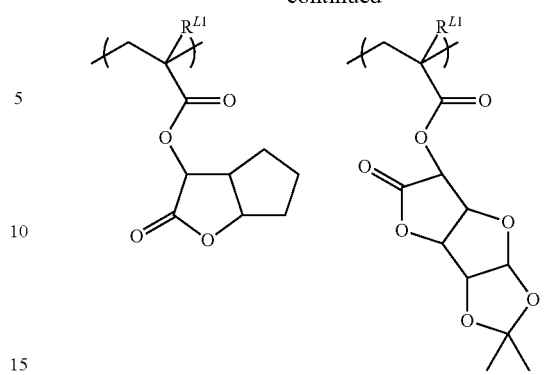
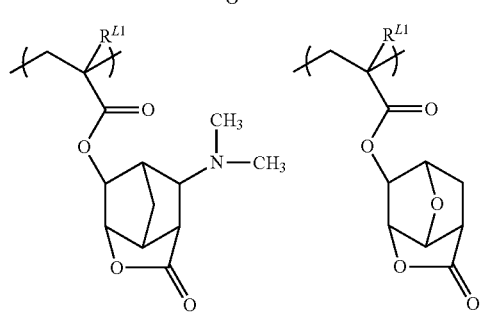
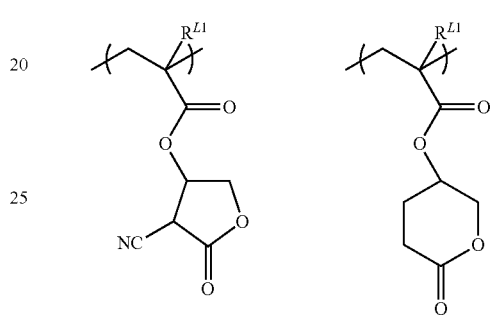
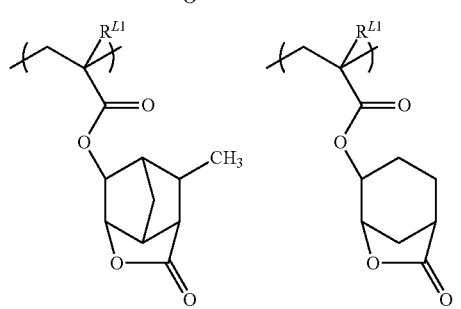
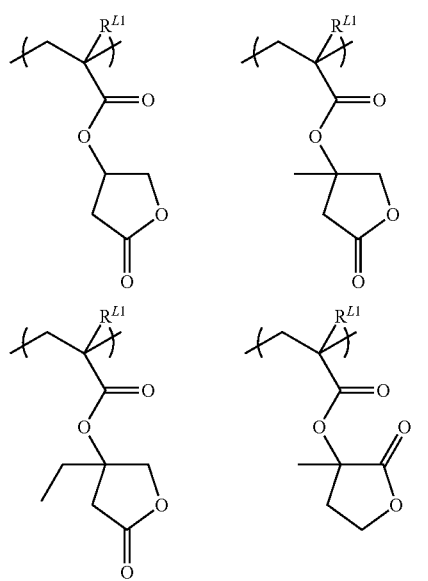
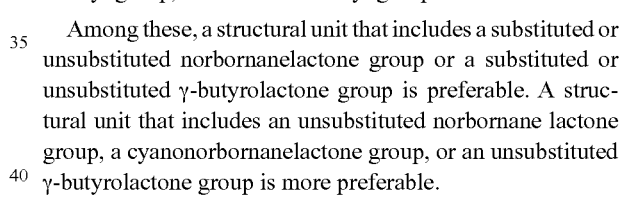

wherein $R^{L1}$ represents a hydrogen atom, a fluorine atom, a methyl group, or a trifluoromethyl group.

Among these, a structural unit that includes a substituted or unsubstituted norbornanelactone group or a substituted or unsubstituted γ-butyrolactone group is preferable. A structural unit that includes an unsubstituted norbornane lactone group, a cyanonorbornanelactone group, or an unsubstituted γ-butyrolactone group is more preferable.

Examples of the structural unit that includes a cyclic carbonate group include structural units shown by the following formulas.

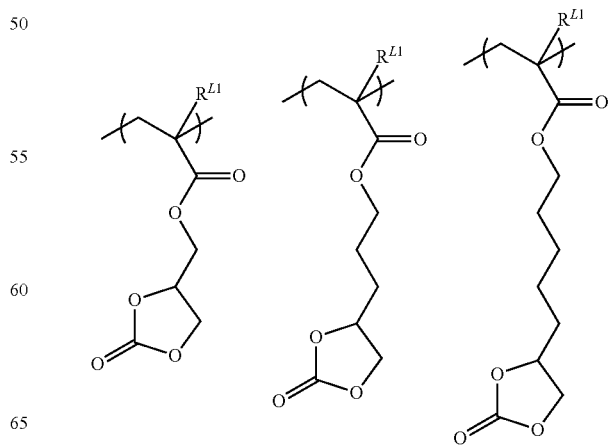

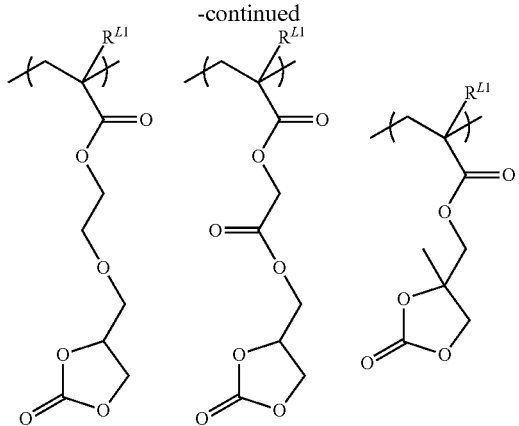

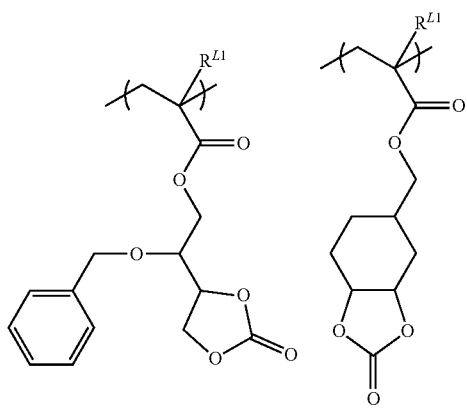

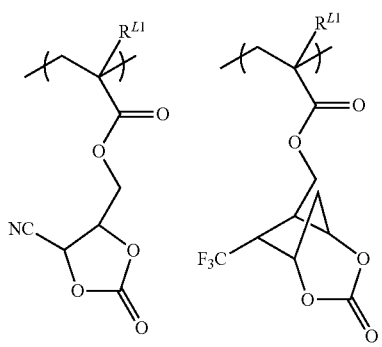

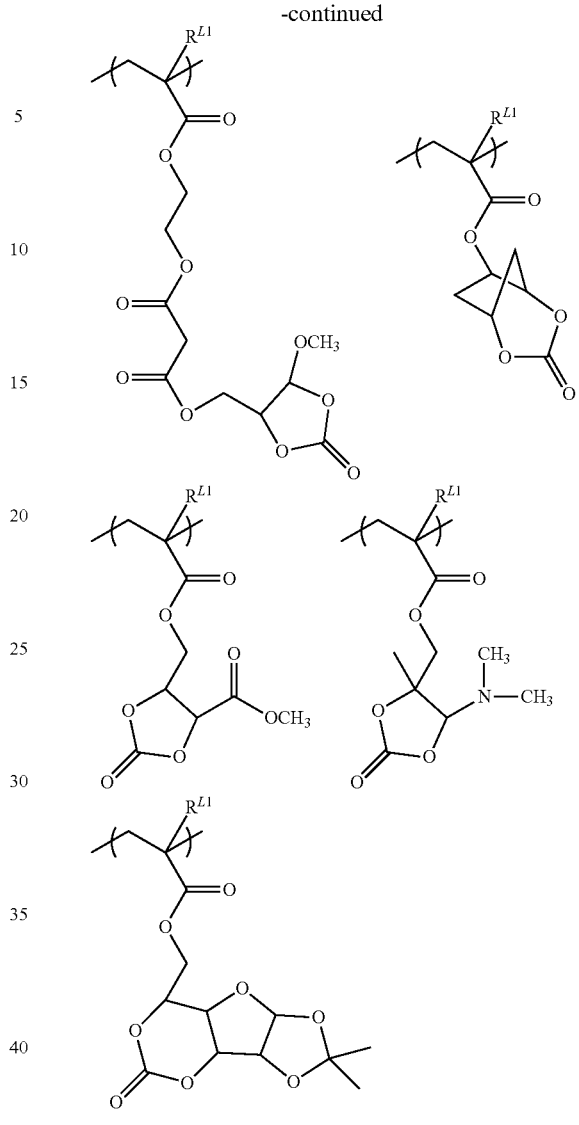

wherein $R^{L1}$ represents a hydrogen atom, a fluorine atom, a methyl group, or a trifluoromethyl group.

Among these, a structural unit that includes a substituted or unsubstituted ethylene carbonate group is preferable. A structural unit that includes an unsubstituted ethylene carbonate group is more preferable.

The content of the structural unit (II) in the polymer (A) is preferably 10 to 80 mol %, more preferably 20 to 70 mol %, and still more preferably 25 to 60 mol %, based on the total structural units included in the polymer (A). If the content of the structural unit (II) is less than 10 mol %, adhesion between the resist film and the substrate may not be improved. If the content of the structural unit (II) exceeds 80 mol %, the pattern-formability may decrease. The polymer (A) may include only one type of structural unit (II), or may include two or more types of structural unit (II).

The polymer (A) may include a structural unit (III) that includes a hydroxyl group. When the polymer (A) includes the structural unit (III), roughness of the resist surface layer can be effectively suppressed. Moreover, adhesion between the resist film and the substrate can be improved.

Specific examples of the structural unit (III) include structural units shown by the following formulas.

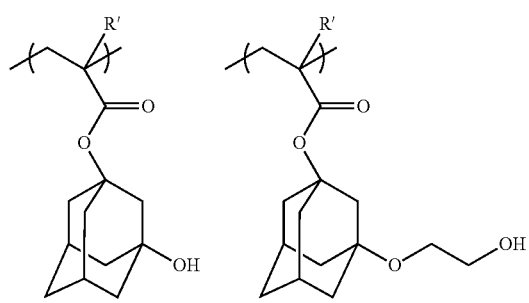
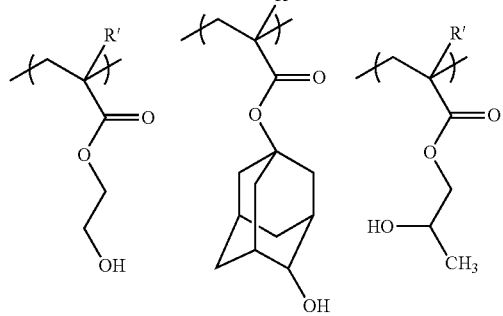
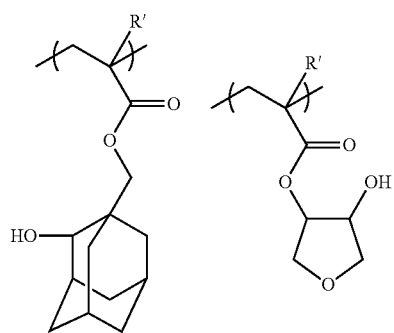
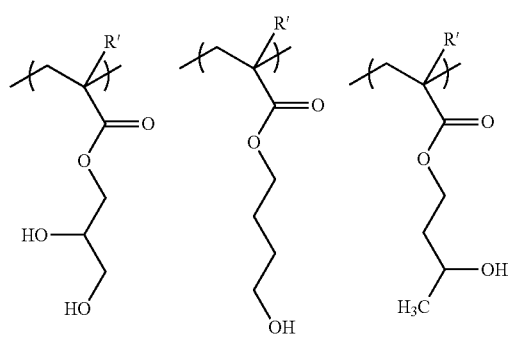
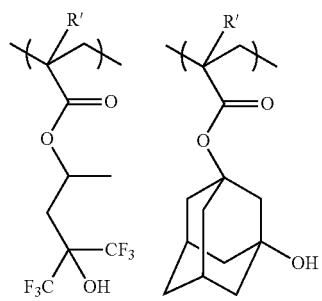
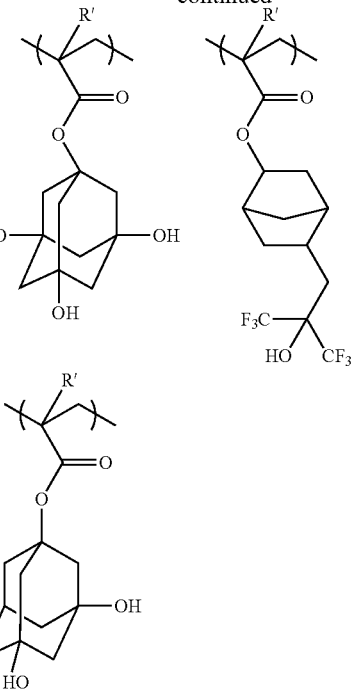

wherein R' represents a hydrogen atom, a fluorine atom, a methyl group, or a trifluoromethyl group.

Among these, a structural unit that includes an adamantane skeleton is preferable. A structural unit that includes a hydroxyadamantyl group is more preferable.

The content of the structural unit (III) in the polymer (A) is preferably 30 mol % or less, more preferably 0 to 20 mol %, and still more preferably 5 to 15 mol %, based on the total structural units included in the polymer (A). If the content of the structural unit (III) exceeds 30 mol %, the pattern-formability may decrease due to a decrease in contrast. The polymer (A) may include only one type of structural unit (III), or may include two or more types of structural unit (III).

The polymer (A) may also include an additional structural unit (e.g., a structural unit that includes a polar group (e.g., cyano group or carbonyl group) other than a hydroxyl group) other than the structural units (I) to (III). The content of the additional structural unit in the polymer (A) is normally 30 mass % or less, and preferably 20 mass % or less, based on the total structural units included in the polymer (A).

Synthesis of Polymer (A)

The polymer (A) may be produced by polymerizing a monomer that produces each structural unit in an appropriate solvent using a radical initiator, for example.

Examples of the radical initiator include azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), and dimethyl 2,2'-azobisisobutyrate; peroxide radical initiators such as benzoyl peroxide, t-butyl hydroperoxide, and cumene hydroperoxide; and the like. Among these, AIBN and dimethyl 2,2'-azobisisobutyrate are preferable. These radical initiators may be used either individually or in combination.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, methyl ethyl ketone, 4-methyl-2-pentanone, and 2-heptanone; ethers such as tetrahydrofuran, dimethoxyethanes, and diethoxyethanes; alcohols such as methanol, ethanol, 1-propanol, 2-propanol, and 4-methyl-2-pentanol; and the like. These solvents may be used either individually or in combination.

The polymerization temperature is normally 40 to 150° C., and preferably 50 to 120° C. The polymerization time is normally 1 to 48 hours, and preferably 1 to 24 hours.

The polystyrene-reduced weight average molecular weight (Mw) of the polymer (A) determined by gel permeation chromatography (GPC) is not particularly limited, but is preferably 1000 to 500,000, more preferably 2000 to 400,000, and still more preferably 3000 to 300,000. If the Mw of the polymer (A) is less than 1000, the heat resistance of the resulting resist film may deteriorate. If the Mw of the polymer (A) exceeds 500,000, the developability of the resulting resist film may deteriorate.

The ratio (Mw/Mn) of the Mw to the polystyrene-reduced number average molecular weight (Mn) of the polymer (A) determined by GPC is normally 1 to 5, preferably 1 to 3, and more preferably 1 to 2.

Acid Generator (B)

The acid generator (B) generates an acid upon exposure to electromagnetic waves or charged particle rays. The acid-dissociable group included in the polymer (A) dissociates due to an acid generated by the acid generator (B), and produces a polar group (e.g., carboxyl group), so that the polymer (A) becomes scarcely soluble in the developer. Examples of the electromagnetic waves include ultraviolet rays, visible rays, deep ultraviolet rays, X-rays, γ-rays, and the like. Examples of the charged particle rays include electron beams, α-rays, and the like. The acid generator (B) may be included in the photoresist composition as a compound (described later) and/or an acid-generating group included in the polymer.

Examples of the acid generator (B) include onium salt compounds, sulfonimide compounds, halogen-containing compounds, diazoketone compounds, and the like. Among these, it is preferable to use an onium salt compound as the acid generator (B).

Examples of the onium salt compounds include sulfonium salts (including tetrahydrothiophenium salts), iodonium salts, phosphonium salts, diazonium salts, pyridinium salts, and the like.

These acid generators (B) may be used either individually or in combination. The acid generator (B) is normally used in an amount of 0.1 to 30 parts by mass, preferably 0.5 to 20 parts by mass, and more preferably 1 to 15 parts by mass, based on 100 parts by mass of the polymer (A), so that the resulting resist exhibits sufficient sensitivity and developability. If the amount of the acid generator (B) is less than 0.1 part by mass, the resulting resist may exhibit insufficient sensitivity and developability. If the amount of the acid generator (B) exceeds 30 parts by mass, the desired resist pattern may not be obtained due to a decrease radiation transmittance.

Optional Component

The photoresist composition may include an additive (e.g., fluorine-containing polymer, acid diffusion controller, solvent, surfactant, solubility controller, or sensitizer) as an optional component other than the polymer (A) and the acid generator (B) as long as the effects of the invention are not impaired.

The photoresist composition may include a fluorine-containing polymer (excluding the polymer (A)). When the photoresist composition includes a fluorine-containing polymer, the fluorine-containing polymer tends to be distributed in the surface layer of the resist film due to the oil repellency of the fluorine-containing polymer, so that elution of the acid generator, an acid diffusion controller, and the like into an immersion medium during liquid immersion lithography can be suppressed. It is also possible to control the advancing contact angle formed by the resist film and the immersion medium within the desired range due to the water repellency of the fluorine-containing polymer, so that bubble defects can be suppressed. Moreover, since the receding contact angle formed by the resist film and the immersion medium can be increased, it is possible to implement a high-speed scan so that waterdrops remain. When the photoresist composition includes a fluorine-containing polymer, a resist film suitable for liquid immersion lithography can be obtained.

The fluorine-containing polymer is not particularly limited. The fluorine-containing polymer may normally be produced by polymerizing one or more fluorine-containing monomers. Examples of the fluorine-containing monomers include monomers including a fluorine atom in the main chain, monomers including a fluorine atom in the side chain, and monomers including fluorine atoms in the main chain and the side chain.

Examples of the monomers including a fluorine atom in the main chain include α-fluoroacrylate compounds, α-trifluoromethyl acrylate compound, β-fluoroacrylate compounds, β-trifluoromethyl acrylate compounds, α,β-fluoroacrylate compounds, α,β-trifluoromethyl acrylate compounds, compounds in which a hydrogen of at least one vinyl site is substituted with a fluorine atom, a trifluoromethyl group, or the like, and the like.

Examples of the monomers including a fluorine atom in the side chain include alicyclic olefin compounds (e.g., norbornene) of which the side chain is substituted with a fluorine atom, a fluoroalkyl group, or a derivative thereof, ester compounds produced by acrylic acid or methacrylic acid and a fluoroalkyl alcohol or a derivative thereof, olefins of which the side chain (i.e., a site that does not include a double bond) is substituted with a fluorine atom, a fluoroalkyl group, or a derivative thereof, and the like.

Examples of the monomers including fluorine atoms in the main chain and the side chain include ester compounds formed by a fluoroalkyl alcohol or a derivative thereof and α-fluoroacrylic acid, β-fluoroacrylic acid, α,β-fluoroacrylic acid, α-trifluoromethylacrylic acid, β-trifluoromethylacrylic acid, or α,β-trifluoromethylacrylic acid, compounds obtained by substituting the side chain of a compound, of which at least one vinyl site is substituted with a fluorine atom, a trifluoromethyl group, or the like, with a fluorine atom, a fluoroalkyl group, or a derivative thereof, compounds obtained by substituting a hydrogen atom of an alicyclic olefin compound that is bonded to the double bond with a fluorine atom, a trifluoromethyl group, or the like, and substituting the side chain thereof with a fluoroalkyl group or a derivative thereof; and the like. Note that the term "alicyclic olefin compound" used herein refers to a compound that includes a double bond in its ring structure.

The fluorine-containing polymer may also include one or more additional structural units (e.g., a structural unit that includes an acid-dissociable group and controls the dissolution rate of the fluorine-containing polymer in the developer, a structural unit that includes a lactone skeleton, a hydroxyl group, a carboxyl group, or the like, a structural unit that includes an alicyclic compound, or a structural unit that is derived from an aromatic compound and suppresses scattering of light due to reflection from the substrate) other than the structural unit derived from the fluorine-containing monomer.

The acid diffusion controller controls diffusion of an acid generated by the acid generator (B) upon exposure within the resist film, and suppresses undesired chemical reactions in the unexposed area. This makes it possible to further improve the storage stability of the photoresist composition, further improve the resolution of the resist, and prevent a change in line width of the resist pattern due to a change in post-exposure delay (PED), so that a composition that exhibits excellent process stability can be obtained.

The acid diffusion controller may be included in the photoresist composition as an isolated compound and/or part of the polymer.

Examples of the acid diffusion controller include nitrogen-containing organic compounds such as amine compounds, amide group-containing compounds, urea compounds, and nitrogen-containing heterocyclic compounds. A nitrogen-containing organic compound in which the hydrogen atom of the amino group is substituted with an acid-dissociable group may be used as the acid diffusion controller.

A photodegradable base that generates a weak acid upon exposure may also be used as the acid diffusion controller. Examples of the photodegradable base include an onium salt compound that loses acid-diffusion controllability upon decomposition due to exposure.

The content of the acid diffusion controller in the photoresist composition is preferably less than 10 parts by mass based on 100 parts by mass of the polymer (A). If the content of the acid diffusion controller exceeds 10 parts by mass, the sensitivity of the resulting resist may decrease. These acid diffusion controllers may be used either individually or in combination.

The photoresist composition normally includes a solvent. The solvent is not particularly limited as long as the solvent can dissolve the polymer (A), the acid generator (B), and the optional components. Specific examples of the solvent include organic solvents mentioned later in connection with a step (1-3) of the pattern-forming method. It is preferable to use an ester solvent or a ketone solvent (more preferably propylene glycol methyl ether acetate, γ-butyrolactone, or cyclohexanone). These solvents may be used either individually or in combination.

The photoresist composition may be produced by mixing the polymer (A), the acid generator (B), and the optional components in a given ratio, for example. The photoresist composition is normally produced by mixing the components so that the total solid content is 1 to 50 mass %, and preferably 3 to 25 mass %, and filtering the solution through a filter having a pore size of about 0.2 μm, for example.

The step (1) includes (1-1) a resist film-forming step, (1-2) an exposure step, and (1-3) a development step using a developer having an organic solvent content of 80 mass % or more. Each step is described in detail below.

Step (1-1)

In the step (1-1), the photoresist composition is applied to a substrate to form a resist film.

A silicon wafer, an aluminum-coated wafer, or the like may be used as the substrate. An organic or inorganic underlayer film as disclosed in Japanese Patent Publication (KOKOKU) No. 6-12452, Japanese Patent Application Publication (KOKAI) No. 59-93448, and the like may be formed on the substrate.

The photoresist composition may be applied by spin coating, cast coating, roll coating, or the like. The thickness of the resist film is normally 0.01 to 1 μm, and preferably 0.01 to 0.5 μm.

The resist film formed by applying the photoresist composition may optionally be prebaked (PB) to vaporize the solvent. The PB temperature is appropriately selected depending on the composition of the photoresist composition, but is normally about 30 to 200° C., and preferably 50 to 150° C.

Step (1-2)

In the step (1-2), the desired area of the resist film formed by the step (1-1) is subjected to reduced projection exposure via a mask having a specific pattern and an optional immersion liquid. For example, the desired area of the resist film may be subjected to reduced projection exposure via an isolated line pattern mask to form an isolated trench pattern. The resist film may be exposed two or more times using the desired pattern mask and another pattern mask. In this case, it is preferable to continuously (successively) expose the resist film. For example, the desired area of the resist film is subjected to first reduced projection exposure via a line-and-space pattern mask, and then subjected to second reduced projection exposure so that the exposed areas (lines) intersect. It is preferable that the area subjected to the first reduced projection exposure perpendicularly intersects the area subjected to the second reduced projection exposure.

This makes it easily to form a circular contact hole pattern in the unexposed area enclosed by the exposed area. Examples of the immersion liquid used for exposure include water, a fluorine-containing inert liquid, and the like. It is preferable that the immersion liquid be transparent to the exposure wavelength, and have a temperature coefficient of the refractive index as small as possible so that distortion of an optical image projected onto the film is minimized. When using an ArF excimer laser (wavelength: 193 nm) as the exposure light source, it is preferable to use water from the viewpoint of availability and ease of handling.

When using water as the immersion liquid, a small amount of an additive that decreases the surface tension of water and increases the surface activity of water may be added to water. It is preferable that the additive does not dissolve the resist layer formed on the wafer, and does not affect the optical coating of the bottom surface of the lens. Distilled water is preferably used as water.

Electromagnetic waves or charged particle rays used for exposure are appropriately selected depending on the type of the acid generator (B). Examples of the electromagnetic waves include ultraviolet rays, visible rays, deep ultraviolet rays, X-rays, γ-rays, and the like. Examples of the charged particle rays include electron beams, α-rays, and the like It is preferable to use deep ultraviolet rays such as ArF excimer laser light or KrF excimer laser light (wavelength: 248 nm). It is more preferable to use ArF excimer laser light. The exposure conditions (e.g., dose) are appropriately selected depending on the composition of the photoresist composition, the type of additive, and the like. The pattern-forming method according to one embodiment of the invention may include a plurality of exposure steps. An identical or different light source may be used in each exposure step. Note that it is preferable to use ArF excimer laser light in the first exposure step.

It is preferable to perform post-exposure bake (PEB) after exposure. The acid-dissociable group included in the composition dissociates smoothly due to PEB. The PEB temperature is normally 30 to 200° C., and preferably 50 to 170° C.

Step (1-3)

In the step (1-3), the resist film exposed in the step (1-2) is developed using a negative developer having an organic solvent content of 80 mass % or more to form a pattern. The term "negative developer" used herein refers to a developer that selectively dissolves and removes a low-dose exposed area and an unexposed area. The organic solvent included in the negative developer is preferably at least one solvent selected from the group consisting of alcohol solvents, ether solvents, ketone organic solvents, amide solvents, ester organic solvents, and hydrocarbon solvents.

Examples of the alcohol solvents include monohydric alcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol methyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ether solvents include diethyl ether, dipropyl ether, dibutyl ether, diphenyl ether, methoxybenzene, anisole (methyl phenyl ether), and the like.

Examples of the ketone solvents include acetone, methyl ethyl ketone, methyl n-propyl ketone, methyl n-butyl ketone, diethyl ketone, methyl i-butyl ketone, methyl n-pentyl ketone (2-heptanone), ethyl n-butyl ketone, methyl n-hexyl ketone, di-i-butyl ketone, trimethylenonane, cyclopentanone, cyclohexanone, cycloheptanone, cyclooctanone, methylcyclohexanone, 2,4-pentanedione, acetonylacetone, acetophenone, and the like.

Examples of the amide solvents include N,N'-dimethylimidazolidinone, N-methylformamide, N,N-dimethylformamide, N,N-dimethylformamide, acetamide, N-methylacetamide, N,N-dimethylacetamide, N-methylpropionamide, N-methylpyrrolidone, and the like.

Examples of the ester solvents include diethyl carbonate, propylene carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvents include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; and the like.

It is preferable to use an ester solvent, a ketone solvent, or an ether solvent (more preferably an ester solvent or an ether solvent). It is particularly preferable to use an ester solvent. The ester solvent is preferably anisole, n-butyl acetate, isopropyl acetate, i-pentyl acetate, methyl ethyl ketone, methyl n-butyl ketone, or methyl n-pentyl ketone, more preferably anisole, n-butyl acetate, or methyl n-pentyl ketone, still more preferably anisole or n-butyl acetate, and particularly preferably n-butyl acetate. These organic solvents may be used either individually or in combination.

The developer has an organic solvent content of 80 mass % or more.

If the developer has an organic solvent content of 80 mass % or more, the contrast of the pattern due to exposure can be improved, so that a pattern that exhibits excellent development characteristics and lithographic performance can be formed. Examples of the components other than the organic solvent include water, silicone oil, and the like.

An appropriate amount of surfactant may optionally be added to the developer. An ionic or nonionic fluorine-containing and/or silicon-containing surfactant or the like may be used as the surfactant.

Examples of the development method include a dipping method that immerses the substrate in a container filled with the developer for a given time, a puddle method that allows the developer to be present on the surface of the substrate due to surface tension for a given time, a spray method that sprays the developer onto the surface of the substrate, a dynamic dispensing method that applies the developer to the substrate that is rotated at a constant speed while scanning a developer application nozzle at a constant speed, and the like.

It is preferable to wash the resist film with a rinse agent after the step (1-3) (development). An organic solvent may be used as the rinse agent so that scum can be efficiently washed away. A hydrocarbon solvent, a ketone solvent, an ester solvent, an alcohol solvent, an amide solvent, or the like is preferable as the rinse agent. Among these, an alcohol solvent and an ester solvent are preferable, and a monohydric alcohol solvent having 6 to 8 carbon atoms is particularly preferable. Examples of the monohydric alcohol solvent having 6 to 8 carbon atoms include linear, branched, or cyclic monohydric alcohols such as 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, and benzyl alcohol. Among these, 1-hexanol, 2-hexanol, 2-heptanol, and 4-methyl-2-pentanol are preferable.

These components may be used either individually or in combination.

Examples of the washing method include a spin washing method that applies the rinse agent to the substrate that is rotated at a constant speed, a dipping method that immerses the substrate in a container filled with the rinse agent for a given time, a spray method that sprays the rinse agent onto the surface of the substrate, and the like.

Step (2)

The pattern-forming method according to one embodiment of the invention includes a step (2) that includes forming a polymer film having a phase separation structure in a space defined by the prepattern obtained by the step (1) using a composition that includes two or more polymers (hereinafter may be referred to as "specific composition").

Specific Composition

The specific composition includes two or more different polymers, and is normally a solution prepared by dissolving two or more immiscible polymers in a solvent.

The types of polymers are not particularly limited as long as the polymers are immiscible. It is preferable to use polymers that differ in polarity. It is more preferable to use a polysiloxane and an aromatic vinyl polymer (e.g., polystyrene).

Polysiloxane

The polysiloxane serves as a polymer having high polarity when used in combination with the aromatic vinyl polymer. The polysiloxane preferably includes a structure obtained by hydrolysis and condensation of at least one hydrolyzable silane compound selected from (a1) a hydrolyzable silane compound shown by the following general formula (1) and (a2) a hydrolyzable silane compound shown by the following general formula (2).

$$R^1_a SiX^1_{4-a} \quad (1)$$

wherein $R^1$ individually represents a fluorine atom, an alkylcarbonyloxy group, or a linear or branched alkyl group having 1 to 20 carbon atoms, $X^1$ individually represents a chlorine atom, a bromine atom, or $OR^a$ (wherein $R^a$ represents a monovalent organic group), and a is an integer from 1 to 3.

$$SiX^2_4 \quad (2)$$

wherein $X^2$ individually represents a chlorine atom, a bromine atom, or $OR^b$ (wherein $R^b$ represents a monovalent organic group).

Examples of the alkyl group having 1 to 5 carbon atoms represented by R in the general formula (1) include linear alkyl groups such as a methyl group, an ethyl group, an n-propyl group, an n-butyl group, and an n-pentyl group, and branched alkyl groups such as an isopropyl group, an isobutyl group, a sec-butyl group, a t-butyl group, and an isoamyl group. Note that at least one hydrogen atom of these alkyl groups may be substituted with a fluorine atom or the like.

Examples of a cyanoalkyl group include a cyanoethyl group, a cyanopropyl group, and the like.

Examples of the alkylcarbonyloxy group include a methylcarbonyloxy group, an ethylcarbonyloxy group, a propylcarbonyloxy group, a butyl carbonyloxy group, and the like.

Examples of a preferable alkenyl group include groups shown by the following general formula (i).

$$CH_2=CH-(CH_2)_n-* \quad (i)$$

wherein n is an integer from 0 to 4, and * indicates a bonding hand.

n in the formula (i) is an integer from 0 to 4, preferably 0 or 1, and more preferably 0 (vinyl group).

Examples of alkenyl groups other than the groups shown by the general formula (i) include a butenyl group, a pentenyl group, a hexenyl group, and the like.

Examples of an aryl group include a phenyl group, a naphthyl group, a methylphenyl group, an ethylphenyl group, a chlorophenyl group, a bromophenyl group, a fluorophenyl group, and the like.

$X^1$ and $X^2$ in the general formulas (1) and (2), respectively, represents a halogen atom (e.g., fluorine atom or chlorine atom), or —$OR^a$ or $OR^b$ (in formulas (1) or (2), respectively). Examples of the monovalent organic group represented by $R^a$ or $R^b$ include alkyl groups having 1 to 4 carbon atoms, such as a methyl group, an ethyl group, an n-propyl group, an isopropyl group, an n-butyl group, an isobutyl group, a sec-butyl group, and a t-butyl group. a in the general formula (1) is an integer from 1 to 3, and preferably 1 or 2.

Specific examples of the compound (a1) shown by the general formula (1) include aromatic ring-containing trialkoxysilanes such as phenyltrimethoxysilane, benzyltrimethoxysilane, phenethyltrimethoxysilane, 4-methylphenyltrimethoxysilane, 4-ethylphenyltrimethoxysilane, 4-methoxyphenyltrimethoxysilane, 4-phenoxyphenyltrimethoxysilane, 4-hydroxyphenyltrimethoxysilane, 4-aminophenyltrimethoxysilane, 4-dimethylaminophenyltrimethoxysilane, 4-acetylaminophenyltrimethoxysilane, 3-methylphenyltrimethoxysilane, 3-ethylphenyltrimethoxysilane, 3-methoxyphenyltrimethoxysilane, 3-phenoxyphenyltrimethoxysilane, 3-hydroxyphenyltrimethoxysilane, 3-aminophenyltrimethoxysilane, 3-dimethylaminophenyltrimethoxysilane, 3-acetylaminophenyltrimethoxysilane, 2-methylphenyltrimethoxysilane, 2-ethylphenyltrimethoxysilane, 2-methoxyphenyltrimethoxysilane, 2-phenoxyphenyltrimethoxysilane, 2-hydroxyphenyltrimethoxysilane, 2-aminophenyltrimethoxysilane, 2-dimethylaminophenyltrimethoxysilane, 2-acetylaminophenyltrimethoxysilane, 2,4,6-trimethylphenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, and 4-acetylaminobenzyltrimethoxysilane; alkyltrialkoxysilanes such as methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, ethylbistris(trimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, n-propyltriacetoxysilane, n-propyltrichlorosilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltriisopropoxysilane, 2-methylpropyltri-n-butoxysilane, 2-methylpropyl-tri-sec-butoxysilane, 2-methylpropyltri-tert-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltriisopropoxysilane, 1-methylpropyltri-n-butoxysilane, 1-methylpropyltri-sec-butoxysilane, 1-methylpropyltri-tert-butoxysilane, 1-methylpropyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, and tert-butyltriphenoxysilane; alkenyltrialkoxysilanes such as vinyltrimethoxysilane, vinyltriethoxysilane, vinyltri-n-propoxysilane, vinyltriisopropoxysilane, vinyltriphenoxysilane, vinyltri-n-butoxysilane, vinyltri-sec-butoxysilane, vinyltri-tert-butoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-tert-butoxysilane, and allyltriphenoxysilane; and the like.

Among these, phenyltrimethoxysilane, 4-methylphenyltrimethoxysilane, 4-methoxyphenyltrimethoxysilane, 4-methylbenzyltrimethoxysilane methyltrimethoxysilane, methyltrimethoxysilane, methyltriethoxysilane, methyltri-n-propoxysilane, methyltriisopropoxysilane, methyltri-n-butoxysilane, methyltri-sec-butoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, vinyltrimethoxysilane, vinyltriethoxysilane, allyltrimethoxysilane, allyltriethoxysilane, and the like are preferable from the viewpoint of reactivity and ease of handling.

Specific examples of the compound (a2) shown by the general formula (2) include tetramethoxysilane, tetraethoxysilane, tetra-n-propoxysilane, tetraisopropoxysilane, tetra-n-butoxysilane, tetra-sec-butoxysilane, tetra-tert-butoxysilane, tetraphenoxysilane, tetrachlorosilane, and the like.

Among these, tetramethoxysilane and tetraethoxysilane are preferable from the viewpoint of reactivity and ease of handling.

A hydrolyzable silane compound shown by the following general formula (ii) (hereinafter may be referred to as "compound (ii)") may optionally be used as the hydrolyzable silane compound used to obtain the polysiloxane (A) in addition to the compounds (a1) and (a2).

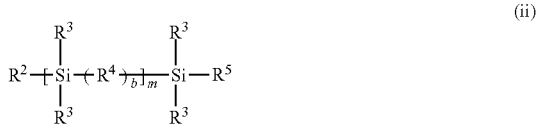

(ii)

wherein $R^2$ and $R^5$ individually represent a hydrogen atom, a hydroxyl group, a fluorine atom, an alkoxy group, a linear or branched alkyl group having 1 to 5 carbon atoms, a cyano group, a cyanoalkyl group, or an alkylcarbonyloxy group, $R^3$ individually represents a monovalent organic group, $R^4$ individually represents an arylene group, a methylene group, or an alkylene group having 2 to 10 carbon atoms, b is an integer from 1 to 3, and m is an integer from 1 to 20.

Examples of the alkoxy group represented by $R^2$ and $R^5$ in the general formula (ii) include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like.

Examples of the linear or branched alkyl group having 1 to 5 carbon atoms include a methyl group, an ethyl group, a propyl group, a butyl group, and the like. Note that at least one hydrogen atom of these alkyl groups may be substituted with a fluorine atom or the like.

Examples of the cyanoalkyl group include a cyanoethyl group, a cyanopropyl group, and the like.

Examples of the alkylcarbonyloxy group include a methylcarbonyloxy group, an ethylcarbonyloxy group, a propylcarbonyloxy group, a butylcarbonyloxy group, and the like.

Examples of the monovalent organic group represented by $R^3$ in the general formula (ii) include an alkyl group, an alkoxy group, an aryl group, an alkenyl group, a group having a cyclic ether structure (e.g., glycidyl group), and the like. Among these, an alkyl group, an alkoxy group, and an aryl group are preferable.

Examples of the alkyl group include linear or branched alkyl groups having 1 to 5 carbon atoms. Specific examples of the alkyl group include a methyl group, an ethyl group, a propyl group, a butyl group, and the like. Note that at least one hydrogen atom of these alkyl groups may be substituted with a fluorine atom or the like.

Examples of the alkoxy group include linear or branched alkoxy groups having 1 to 10 carbon atoms. Specific examples of the alkoxy group include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like.

Examples of the aryl group include a phenyl group, a naphthyl group, a methylphenyl group, a benzyl group, a phenethyl group, an ethylphenyl group, a chlorophenyl group, a bromophenyl group, a fluorophenyl group, and the like. Among these, a phenyl group is preferable.

Examples of the alkenyl group include a vinyl group, a 1-propenyl group, a 2-propenyl group (allyl group), a 3-butenyl group, a 3-pentenyl group, a 3-hexenyl group, and the like.

When a plurality of $R^4$ are present (i.e., when m is an integer from 2 to 20), the plurality of $R^4$ may be either the same or different.

The arylene group represented by $R^4$ in the general formula (ii) is preferably an arylene group having 6 to 10 carbon atoms, for example. Specific examples of the arylene group include a phenylene group, a naphthylene group, a methylphenylene group, an ethylphenylene group, a chlorophenylene group, a bromophenylene group, a fluorophenylene group, and the like.

Examples of the alkylene group having 2 to 10 carbon atoms include an ethylene group, a propylene group, a butylene group, and the like.

b in the general formula (ii) is an integer from 1 to 3, and preferably 1 or 2.

m is an integer from 1 to 20, preferably an integer from 5 to 15, and more preferably an integer from 5 to 10.

Specific examples of the compound (ii) include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-isopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, bis(dimethylmethoxysilyl)methane, bis(dimethylethoxysilyl)methane, bis(dimethyl-n-propoxysilyl)methane, bis(dimethylisopropoxysilyl)methane, bis(dimethyl-n-butoxysilyl)methane, bis(dimethyl-sec-butoxysilyl)methane, bis(dimethyl-tert-butoxysilyl)methane, 1,2-bis(dimethylmethoxysilyl)ethane, 1,2-bis(dimethylethoxysilyl)ethane, 1,2-bis(dimethyl-n-propoxysilyl)ethane, 1,2-bis(dimethylisopropoxysilyl)ethane, 1,2-bis(dimethyl-n-butoxysilyl)ethane, 1,2-bis(dimethyl-sec-butoxysilyl)ethane, 1,2-bis(dimethyl-tert-butoxysilyl)ethane, 1-(dimethoxymethylsilyl)-1-(trimethylsilyl)methane, 1-(diethoxymethylsilyl)-1-(trimethylsilyl)methane, 1-(di-n-propoxymethylsilyl)-1-(trimethylsilyl)methane, 1-(diisopropoxymethylsilyl)-1-(trimethylsilyl)methane, 1-(di-n-butoxymethylsilyl)-1-(trimethylsilyl)methane, 1-(di-sec-butoxymethylsilyl)-1-(trimethylsilyl)methane, 1-(di-tert-butoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1-(di-n-propoxymethylsilyl)-2-(trimethylsilyl)ethane, 1-(diisopropoxymethylsilyl)-2-(trimethylsilyl)ethane, 1-(di-n-butoxymethylsilyl)-2-(trimethylsilyl)ethane, 1-(di-sec-butoxymethylsilyl)-2-(trimethylsilyl)ethane, 1-(di-tert-butoxymethylsilyl)-2-(trimethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, 1,4-bis(tri-tert-butoxysilyl)benzene, and the like.

Further specific examples of the compound (ii) include polycarbosilanes such as polydimethoxymethylcarbosilane and polydiethoxymethylcarbosilane.

Among these, hexamethoxydisilane, hexethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, bis(dimethylmethoxysilyl)methane, bis(dimethylethoxysilyl)methane, 1,2-bis(dimethylmethoxysilyl)ethane, 1,2-bis(dimethylethoxysilyl)ethane, 1-(dimethoxymethylsilyl)-1-(trimethylsilyl)methane, 1-(diethoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, dimethoxymethylcarbosilane, polydiethoxymethylcarbosilane, and the like are preferable.

These compounds (ii) may be used either individually or in combination.

The photoresist composition (pattern-forming material) may include only one type of polysiloxane (A), or may include two or more types of polysiloxane (A).

The polystyrene-reduced weight average molecular weight of the polysiloxane (A) determined by size exclusion chromatography is preferably 1000 to 200,000, more preferably 1000 to 100,000, and particularly preferably 1000 to 50,000.

The molecular weight of the polysiloxane (A) is measured by gel permeation chromatography (GPC) using GPC columns manufactured by Tosoh Corporation (G2000HXL×2, G3000HXL×1, G4000HXL×1) (standard: monodisperse polystyrene, flow rate: 1.0 ml/min, eluant: tetrahydrofuran, column temperature: 40° C.).

The compound (1), the compound (2), and an optional additional hydrolyzable silane compound may be subjected to hydrolysis and/or partial condensation by a known method.

Aromatic Vinyl Polymer

The aromatic vinyl polymer may be obtained by polymerizing a monomer component including an aromatic vinyl monomer.

Examples of the aromatic vinyl monomer include styrene; alkyl-substituted styrenes such as α-methylstyrene, β-methylstyrene, and p-methylstyrene; halogen-substituted styrenes such as 4-chlorostyrene and 4-bromostyrene; hydroxystyrenes such as p-hydroxystyrene, 2-methyl-4-hydroxystyrene, and 3,4-dihydroxystyrene; vinylbenzyl alcohols; alkoxy-substituted styrenes such as p-methoxystyrene, p-t-butoxystyrene, and m-t-butoxystyrene; vinylbenzoic acids such as 3-vinylbenzoic acid and 4-vinylbenzoic acid; 2-phenylacrylic acid; vinylbenzoates such as methyl 4-vinylbenzoate and ethyl 4-vinylbenzoate; 4-vinylbenzyl acetate; 4-acetoxystyrene; vinylacetophenones such as p-butenylacetophenone and m-isopropinylacetophenone; amide-styrenes such as 2-butylamide-styrene, 4-methylamide-styrene, and p-sulfonamide-styrene; aminostyrenes such as 3-aminostyrene, 4-aminostyrene, 2-isopropenylaniline, and vinylbenzyldimethylamine; nitrostyrenes such as 3-nitrostyrene and 4-nitrostyrene; cyanostyrenes such as 3-cyanostyrene and 4-cyanostyrene; vinylphenylacetonitrile; arylstyrenes such as phenylstyrene; vinylnaphthalene; vinylanthracene; 1,1-diphenylethylene; and the like. Among these, styrene, α-methylstyrene, and hydroxystyrenes are preferable.

The aromatic vinyl polymer may be obtained by copolymerizing the aromatic vinyl monomer and an additional monomer as long as the performance of the polymer is not impaired.

Examples of the additional monomer include vinyl cyanide monomers such as acrylonitrile and methacrylonitrile; alkyl acrylates such as methyl acrylate and ethyl acrylate; benzyl acrylate; phenyl acrylate; hydroxyalkyl acrylates such as 2-hydroxyethyl acrylate and 3-hydroxypropyl acrylate; alkyl methacrylates such as methyl methacrylate and ethyl methacrylate; benzyl methacrylate; phenyl methacrylate; hydroxyalkyl methacrylates such as 2-hydroxyethyl methacrylate and 3-hydroxypropyl methacrylate; and the like.

The content of a structural unit derived from the aromatic vinyl monomer in the aromatic vinyl polymer is preferably 50 to 100 wt %, and more preferably 80 to 100 wt %.

An organic peroxide that generates free radicals, or an azobis radical initiator may be used when synthesizing the aromatic vinyl polymer by radical polymerization.

Combination of Polymers

Examples of a preferable combination of two or more different polymers other than the polysiloxane and the aromatic vinyl polymer include a combination of two or more polymers that differ in content of polar groups (e.g., hydroxyl group or carboxyl group).

Examples of suitable polymers for the two or more immiscible polymers include cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinylsulfonic acid), poly(2-sulfoethyl methacrylate), poly(2-sulfopropyldimethyl-3-methacrylamide), poly(1,1,1-trifluoro-2-(trifluoromethyl)-2-hydroxypentan-4-yl methacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinylnaphthalene), polysiloxanes, polymethylsilsesquioxanes, polycarbosilanes, poly(vinylferrocene), poly(acylonitrile), poly(caprolactone), poly(lactide), poly(methyl methacrylate), poly(2-hydroxyethyl methacrylate), poly(γ-butyrolactone methacrylate), poly(tetrahydrofuranyl methacrylate), poly(tetrahydropyranyl methacrylate), poly(allylamine), poly(4-aminostyrene), poly(2-dimethylaminoethyl methacrylate), polyethyleneneimine, poly(N-methylvinylamine), poly(vinylpyridine), poly(isoprene), poly(butadiene), poly(nobomene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluorostyrene), and substituted derivatives thereof. The two or more immiscible polymers may be selected such that each polymer is immiscible with each other polymer in the blend.

Solvent

The specific composition is normally produced by dissolving two or more different polymers in a solvent. The solvent employed herein is preferably a solvent that dissolves or disperses the polymers included in the composition. For example, the solvent used in the step (1-3), or the like may preferably be used.

The step (2) includes forming a polymer film having a phase separation structure in a space defined by the prepattern obtained by the step (1) using the specific composition.

After applying the specific composition to the substrate in a space defined by the prepattern to form a thin film, the thin film is baked to vaporize the solvent and promote phase separation of the polymers. A polymer film having a phase separation structure is thus obtained.

In the step (2), the specific composition is applied to the substrate to form the polymer film.

The specific composition may be applied by spin coating, cast coating, roll coating, or the like. The thickness of the polymer film is normally 0.01 to 1 μm, and preferably 0.01 to 0.5 μm.

After applying the specific composition, the thin film is baked to vaporize the solvent and promote phase separation of the polymers. The baking temperature is appropriately selected depending on the composition of the specific composition, but is normally about 30 to 200° C., and preferably 50 to 150° C.

The phase separation structure is preferably a structure in which one phase is distributed along the prepattern obtained by the step (1).

Step (3)

The pattern-forming method according to one embodiment of the invention includes a step (3) that includes removing part of the phase separation structure of the polymer film obtained by the step (2).

In the step (3), only one of the polymers is selectively removed by wet etching or reactive ion etching (RIE).

When using wet etching, part of the phase separation structure is dissolved and removed using a solvent. As the solvent, a solvent that may be used in the step (1-3) and dissolves only the polymer that is included in the polymer film and forms the removal target phase may be selectively used.

EXAMPLES

The invention is further described below by way of examples. Note that the invention is not limited to the following examples. In the examples, the unit "%" refers to "mass %" unless otherwise specified.

Weight Average Molecular Weight (Mw) and Number Average Molecular Weight (Mn)

The weight average molecular weight (Mw) and the number average molecular weight (Mn) of the polymer were measured by gel permeation chromatography (GPC) using GPC columns manufactured by Tosoh Corporation (G2000HXL×2, G3000HXL×1, G4000HXL×1) under the following conditions.

Eluate: tetrahydrofuran (manufactured by Wako Pure Chemical Industries, Ltd.)
Flow rate: 1.0 ml/min
Sample concentration: 1.0 mass %
Amount of sample introduced: 100 µl
Detector: differential refractometer
Standard: monodisperse polystyrene $^{13}$C-NMR Analysis The polymer was subjected to $^{13}$C-NMR analysis (solvent: DMSO-$d_6$) using an instrument "JNM-EX400" (manufactured by JEOL Ltd.).

Synthesis Example 1

Synthesis of Polymer for Photoresist Composition 50 mol % of 2-methyl-2-adamantyl methacrylate, 50 mol % of 2,6-norbornenecarbolactone methacrylate, and 5 mol % of 2,2'-azobisisobutyronitrile (initiator) were dissolved in 60 g of methyl ethyl ketone to prepare a monomer solution. Note that the amount (mol %) of each monomer compound is based on the total amount of the monomer compounds, and the amount (mol %) of the initiator is based on the total amount of the monomer compounds and the initiator. The total mass of the monomer compounds was 30 g.

A 500 ml three-necked flask equipped with a thermometer and a dropping funnel was charged with 30 g of a methyl ethyl ketone, and purged with nitrogen for 30 minutes. The inside of the flask was heated to 80° C. while stirring the mixture using a magnetic stirrer.

The monomer solution was added dropwise to the flask over 3 hours using the dropping funnel. The monomers were polymerized for 6 hours from the start of addition of the monomer solution. The mixture was then cooled to 30° C. or less to obtain a polymer solution. The polymer solution was then added to 600 g of methanol, and a precipitated white powder was collected by filtration. The white powder thus collected was washed twice with 120 g of methanol in a slurry state, collected by filtration, and dried at 50° C. for 17 hours to obtain a white powdery polymer (A) (yield: 84.5%). As a result of $^{13}$C-NMR analysis, it was found that the polymer (A) contained structural units derived from 2-methyl-2-adamantyl methacrylate and 2,6-norbornenecarbolactone methacrylate in a ratio of 48.2:51.8 (mol %). The polymer (A) had an Mw of 5500 and an Mw/Mn ratio of 1.38.

Synthesis Example 2

Synthesis of Fluorine-Containing Polymer for Photoresist Composition 35.8 g (70 mol %) of 1-ethyl-1-cyclopentyl methacrylate and 14.2 g (30 mol %) of 2-trifluoroethyl methacrylate were dissolved in 100 g of methyl ethyl ketone. 3.2 g of dimethyl 2,2'-azobisisobutyrate (initiator) was then added to the solution to prepare a monomer solution. A 500 ml three-necked flask was charged with 100 g of methyl ethyl ketone, purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled to 30° C. or less, and washed with 825 g of a methanol/methyl ethyl ketone/hexane mixed solution (2/1/8 (mass ratio)). The solvent was then replaced with propylene glycol methyl ether acetate to obtain a solution of a polymer (F) (38.0 g (solid content), yield: 76.0%). As a result of $^{13}$C-NMR analysis, it was found that the polymer (F) contained structural units derived from 1-ethyl-1-cyclopentyl methacrylate and 2-trifluoroethyl methacrylate in a ratio of 70.2:29.8 (mol %). The polymer (F) had an Mw of 7000 and an Mw/Mn ratio of 1.40.

Production Example

Production of Photoresist Composition 100 parts by mass of the polymer (A), 3 parts by mass of the polymer (F), 9.8 parts by mass of triphenylsulfonium 2-(1-adamantyl)-1,1-difluoroethanesulfonate (acid generator), 1.8 parts by mass of N-(t-pentylcarbonyl)-4-hydroxypiperidine (acid diffusion controller), 2200 parts by mass of propylene glycol methyl ether acetate (solvent), 950 parts by mass of cyclohexanone (solvent), and 30 parts by mass of γ-butyrolactone (solvent) were mixed. The resulting solution was filtered through a filter having a pore size of 0.2 µm to prepare a photoresist composition.

Example 1

Production of Evaluation Substrate A

A lower-layer antireflective film composition ("ARC29A" manufactured by Brewer Science) was spin-coated onto an 8-inch silicon wafer using a system "CLEAN TRACK ACT8" (manufactured by Tokyo Electron Ltd.), and baked at 205° C. to form a film (thickness: 77 nm). The photoresist composition produced in the Production Example was spin-coated onto the film, and pre-baked (110° C., 90 seconds) to form a resist layer (thickness: 75 nm). The resist layer was exposed via a mask pattern using an ArF exposure system ("NSR-5306C" manufactured by Nikon Corporation) (NA: 0.78, σ: 0.85, ⅔Ann). The resist layer was then developed (developer: butyl acetate) for 60 seconds using an LD nozzle of the system "CLEAN TRACK ACT8" to obtain an evaluation substrate A on which a 90 nm line/140 nm pitch (dimension of the space: 50 nm) prepattern was formed.

Formation of Pattern

A 0.9% butyl acetate solution of poly(1-(4-hydroxyphenyl)ethylsilsesquioxane-ran-(1-(phenyl)ethylsilsesquioxane)) (poly(HMBS$_{70}$-r-MBS$_{30}$) and polystyrene (5.5 k) (mass ratio: 4:6) was prepared. The solution was spin-coated onto the evaluation substrate A at 3000 rpm/30 sec, and baked (120° C./60 sec) on a hot plate. The resulting film was developed by immersing the evaluation substrate A in cyclohexane for 60 seconds, and then dried. The dried film was observed using an SEM. It was confirmed that the dimension of the space had decreased to 37 nm from 50 nm.

Examples 2 to 4

Production of Evaluation Substrates B-1 to B-3

A lower-layer antireflective film composition ("ARC29A" manufactured by Brewer Science) was spin-coated onto a 12-inch silicon wafer using a system "CLEAN TRACK ACT8" (manufactured by Tokyo Electron Ltd.), and baked at 205° C. to form a film (thickness: 77 nm). The photoresist composition produced in the Production Example was spin-coated onto the film, and pre-baked (120° C., 60 seconds) to form a resist layer (thickness: 80 nm). The resist layer was exposed via a mask pattern using an ArF liquid immersion lithography system ("NSR-S610C" manufactured by Nikon Corporation) (NA: 1.30, CrossPole, σ: 0.977/0.78). The resist layer was then developed (developer: butyl acetate) for 60 seconds using an LD nozzle of the system "CLEAN TRACK ACTS" to obtain an evaluation substrate B-1 on which a 70 nm hole/110 nm pitch prepattern was formed, an evaluation substrate B-2 on which a 55 nm hole/110 nm pitch prepattern was formed, or an evaluation substrate B-3 on which a 45 nm hole/110 nm pitch prepattern was formed.

Formation of Pattern

A 0.9% butyl acetate solution of poly($HMBS_{70}$-r-$MBS_{30}$) and poly(styrene-ran-4-hydroxystyrene) (poly($S_{95}$-r-$HOST_5$)) (4.5 k) (mass ratio: 4:6) was prepared. The solution was spin-coated onto each evaluation substrate at 3000 rpm/30 sec, and baked (120° C./60 sec) on a hot plate. The resulting film was developed by immersing the evaluation substrate in cyclohexane for 60 seconds, and then dried. The dried film was observed using an SEM. It was confirmed that the dimension of the hole had decreased as shown in Table 1.

TABLE 1

| | Evaluation substrate | Dimension of hole of prepattern (nm) | Reduced dimension of hole (nm) |
|---|---|---|---|
| Example 2 | B-1 | 70 | 57 |
| Example 3 | B-2 | 55 | 48 |
| Example 4 | B-3 | 45 | 38 |

Obviously, numerous modifications and variations of the present invention are possible in the light of the above teachings. It is therefore to be understood that within the scope of the appended claims, the invention may be practiced otherwise than as specifically described herein.

What is claimed as new and is desired to be secured by Letters Patent of the United States is:

1. A pattern-forming method comprising:
   applying a photoresist composition to a substrate to form a resist film, the photoresist composition including an acid generator and a first polymer that includes an acid-dissociable group;
   exposing the resist film;
   developing the resist film using a developer having an organic solvent content of 80 mass % or more to form a prepattern of the resist film;
   applying a mixture of a plurality of second polymers in a space defined by the prepattern, the plurality of second polymers each being a polymer selected from the group consisting of a homopolymer and a random copolymer;
   heating the mixture of a plurality of second polymers to form a polymer film having a phase separation structure in the space defined by the prepattern, the phase separation structure including a first phase distributed along the prepattern and a second phase not adjacent to the prepattern; and
   removing the second phase of the phase separation structure of the polymer film while remaining the first phase of the phase separation structure of the polymer film.

2. The pattern-forming method according to claim 1, wherein the second phase of the phase separation structure is removed by wet development.

3. The pattern-forming method according to claim 1, further comprising:
   forming an underlayer film on the substrate before applying the photoresist composition to the substrate.

4. The pattern-forming method according to claim 3, wherein the underlayer film includes a spin-on carbon film.

5. The pattern-forming method according to claim 1, wherein at least one of the plurality of second polymers is a polysiloxane.

6. The pattern-forming method according to claim 5, wherein the polysiloxane includes a structure obtained by hydrolysis and condensation of at least one hydrolyzable silane compound selected from a hydrolyzable silane compound shown by a general formula (1) and a hydrolyzable silane compound shown by a general formula (2), and has a polystyrene-reduced weight average molecular weight determined by gel permeation chromatography of 1000 to 200,000,

$$R^1_a SiX^1_{4-a} \quad (1)$$

wherein
a is an integer from 1 to 3,
$R^1$ individually represents a fluorine atom, an alkylcarbonyloxy group, or a linear or branched alkyl group having 1 to 20 carbon atoms,
each $R^1$ is a same as or different from each other when a is 2 or 3,
$X^1$ individually represents a chlorine atom, a bromine atom, or $OR^a$, wherein $R^a$ represents a monovalent organic group, and
each $X^1$ is a same as or different from each other when a is 1 or 2,

$$SiX^2_4 \quad (2)$$

wherein
$X^2$ individually represents a chlorine atom, a bromine atom, or $OR^b$, wherein $R^b$ represents a monovalent organic group, and
each $X^2$ is a same as or different from each other.

7. The pattern-forming method according to claim 6, wherein the polysiloxane further includes a structure obtained by hydrolysis and condensation of a hydrolyzable silane compound shown by a general formula (3),

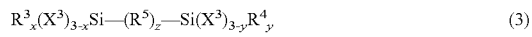

$$R^3_x(X^3)_{3-x}Si-(R^5)_z-Si(X^3)_{3-y}R^4_y \quad (3)$$

wherein
x is an integer from 0 to 2,
y is an integer from 0 to 2,
z is 0 or 1,
$R^3$ individually represents a monovalent organic group,
each $R^3$ is a same as or different from each other when x is 2,
$R^4$ individually represents a monovalent organic group,
each $R^4$ a same as or different from each other when y is 2,
$R^5$ individually represents an oxygen atom, a phenylene group, or a group shown by $-(CH_2)_n-$, wherein n is an integer from 1 to 6,
$X^3$ individually represents a halogen atom or $OR^c$, wherein $R^c$ represents a monovalent organic group, and
each $X^3$ is a same as or different from each other.

8. The pattern-forming method according to claim 1, wherein at least one of the plurality of second polymers is an aromatic vinyl polymer.

9. The pattern-forming method according to claim 1, wherein the acid-dissociable group included in the first polymer includes an alicyclic hydrocarbon group.

10. The pattern-forming method according to claim 1, wherein the first polymer includes a structural unit shown by a formula (4),

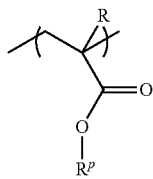

(4)

wherein

R represents a hydrogen atom, a fluorine atom, a methyl group, or a trifluoromethyl group, and $R^p$ represents an acid-dissociable group shown by a formula (i),

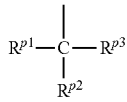

(i)

wherein $R^{p1}$ represents an alkyl group having 1 to 4 carbon atoms or a monovalent alicyclic hydrocarbon group having 4 to 12 carbon atoms, and each of $R^{p2}$ and $R^{p3}$ individually represents an alkyl group having 1 to 4 carbon atoms or a monovalent alicyclic hydrocarbon group having 4 to 12 carbon atoms, or each of $R^{p2}$ and $R^{p3}$ individually represents an alkyl group having 1 to 4 carbon atoms or a monovalent alicyclic hydrocarbon group having 4 to 12 carbon atoms, and $R^{p2}$ and $R^{p3}$ bond to each other to form a divalent alicyclic hydrocarbon group having 4 to 12 carbon atoms together with the carbon atom bonded to $R^{p2}$ and $R^{p3}$.

11. The pattern-forming method according to claim 1, wherein the organic solvent is at least one solvent selected from a group consisting of ether solvents, ketone solvents, and ester solvents.

12. The pattern-forming method according to claim 1, the phase separation structure does not include the first phase which is not distributed along the prepattern.

13. The pattern-forming method according to claim 1, wherein the mixture of the plurality of second polymers applied in the space defined by the prepattern contacts the prepattern, and the first phase of the phase separation structure contacts the prepattern.

14. The pattern-forming method according to claim 13, the phase separation structure does not include the first phase which does not contact the prepattern.

* * * * *